United States Patent [19]

Katsura

[11] Patent Number: 5,373,509
[45] Date of Patent: Dec. 13, 1994

[54] SEMICONDUCTOR MEMORY DEVICE AND METHOD OF TESTING THE SAME

[75] Inventor: Joji Katsura, Hyogo, Japan

[73] Assignee: Matsushita Electric Industrial Co., Ltd., Osaka, Japan

[21] Appl. No.: 913,356

[22] Filed: Jul. 15, 1992

[30] Foreign Application Priority Data

Jul. 23, 1991 [JP] Japan .................. 3-182410

[51] Int. Cl.⁵ ............................................. G01R 31/28
[52] U.S. Cl. .................... 371/21.2; 365/201; 371/21.1
[58] Field of Search ............... 371/21.1, 21.3, 21.2, 371/15.1; 365/201, 238.5

[56] References Cited

U.S. PATENT DOCUMENTS

| | | | |
|---|---|---|---|
| 5,072,137 | 12/1991 | Slemmer | 371/21.1 |
| 5,185,722 | 2/1993 | Ota et al. | 371/21.1 |
| 5,258,954 | 11/1993 | Furuyama | 371/21.1 |
| 5,265,100 | 11/1993 | McClure et al. | 371/21.2 |

OTHER PUBLICATIONS

S. Mori et al., *A 45ns 64Mb DRAM With A Merged Match-Line Test Architecture*, IEEE ISSCC Digest of Technical Papers, pp. 110–111 (Feb. 1991).

*Primary Examiner*—Vincent P. Canney
*Attorney, Agent, or Firm*—Willian Brinks Hofer Gilson & Lione

[57] ABSTRACT

Provided are a row address circuit for driving all word lines at one time so as to select all memory cells in a memory circuit when receiving a writing control signal for test and a column address circuit for writing some particular pattern of test data which corresponds to a data specifying signal into the memory cells at one time via all pairs of bit lines when receiving the writing control signal. Also, provided in the memory circuit is a test circuit for judging at one time whether the data held in each memory cell conforms with an expected value thereof. Thus a time required for testing a semiconductor memory device of a large capacity is reduced.

11 Claims, 5 Drawing Sheets

SEMICONDUCTOR MEMORY DEVICE AND METHOD OF TESTING THE SAME

BACKGROUND OF THE INVENTION

This invention relates to a semiconductor memory device having a specific circuit construction for a test and a method of testing the same.

For checking the quality of a plurality of memory cells, various tests such as SCAN, MARCHING are conducted in not only general purpose semiconductor memory devices such as SRAM, DRAM but also on-chip type semiconductor memory devices in which a memory circuit is built on a same chip as a processor.

As to the SCAN widely known as an essential test, a non-inverse pattern of test data, namely, ALL "0"s is applied so that "0" is sequentially written into all memory cells. Then, the data held In respective memory cells are sequentially read out to check whether the read-out data conform with an expected value "0". In case where unconformity is detected in any of the memory cells, the test results in FAIL at that time. In case where the conformity is obtained in every memory cell, an inverse pattern of test data, namely, ALL "1"s is applied so that "1" is sequentially written into all memory cells. Then, the data held in respective memory cells are sequentially checked whether the data conform with an expected value "1". In case only where the conformity is obtained in every memory cell, the test results in PASS.

As to the MARCHING, the non-inverse pattern of test data (ALL "0"s) is applied so that the test data "0" is sequentially written into all the memory cells similarly to the SCAN. Then, the data held In the memory cell of the first address is read out to check whether the data conforms with the expected value "0". In case where the unconformity is detected in the memory cell the test results in FAIL at that time. In case where the conformity is obtained in the memory cell, "1" is written into the memory cell of the first address and checked is whether the data held in the memory cell of the second address conforms with the expected value "0". In case where the conformity is obtained in the second address memory cell, "1"is written into the second address memory cell and checked is whether the data held in the third address memory cell conforms with the expected value "0". Each memory cell is checked sequentially until the data held in all memory cells are rewritten into "1" in such a manner. This is a forward process for the non-inverse pattern. Then a backward process for the same pattern is executed. In detail, sequentially from the memory cell of the final address, while checking whether a read-out data conforms with the expected value "1", "0"is written into the memory cells. The sequential judgment to each memory cell is executed until the data held in all memory cells are returned to "0". Further, the inverse pattern of test data (ALL "1"s) is applied and similar forward/backward processes are executed.

As described above, in case of a semiconductor memory device having N memory cells to which addresses are differently allocated From one another, memory accesses of $2N \times 2$ times in the SCAN and $5N \times 2$ times in the MARCHING are respectively required. The test which requires such memory accesses of multiple times of N is commonly called N-system test.

Recently, semiconductor memory devices have been increasing in their memory capacity. For example, the capacity of general purpose semiconductor memory devices has been developed to 1M bits, 4M bits or 16M bits in SRAMs and to 4M bits, 16M Bits or 64M bits in DRAMs and is further being increased. On-chip type semiconductor memory devices are also promoted to increase their memory capacity.

Suppose that a time required for one memory access (operation cycle time) T is 100 ns, in the semiconductor memory device with $4M \times 1$-bit memory construction (N=4M bits), a total test time in the SCAN ($2N \times 2 \times T$) rows to about 1.6 s and that of the MARCHING ($5N \times 2 \times T$) grows to about 4.0 s Accompanied by the increase in the memory capacity, it is hard to ignore the time required for executing the memory test even in case of the N-system test.

Conventionally, $N^{1.5}$-system test or $N^2$-system test is applied for enhancing an error detecting rate. It is practically difficult, however, to perform tests other than the N-system test as long as the conventional method is adopted. In case of the $N^2$-system test which requires, for example, $4N^2$ times memory accesses, under the same condition (N=4M bits, T=100ns), the total test time ($4N^2 \times T$) is about $6.4 \times 10^6$ s (about 74 days). Usually discussed is a cost for test time in a level of a Few seconds, thus such the value is out of discussion.

In view of the above problem, as one of techniques for reducing the test time, a merged match-line test method is proposed in "A 45 ns 64 Mb DRAM with a Merged Match-line Test Architecture", Mori, S., et al., IEEE ISSCC Digest of Technical Papers, page 110-111, February, 1991. In this method, a plurality of memory cells connected to one word line are tested at one time. Further, wires used as a pair of data output lines during a normal read-out operation are used as a pair of match lines during the test.

In the merged match line test method, however, data are read out to the pair of match lines by activating one word line, therefore the method can be applied only to a test per one word. The reduction of test time is thus restricted. Moreover, since the construction is such that the pair of match lines are both precharged simultaneously and an error detection can be carried out only when both lines are in an electric potential of "L", an electric current is conducted through one of the pair of match lines even when no memory errors exist, thus increasing an consumptive electric current during the test.

The present invention has its object to reduce the test time to the minimum. Another object of the present invention is to lower the consumptive electric current during the test.

SUMMARY OF THE INVENTION

To attain tile above objects, In the present invention, some particular pattern of test data is written at one time into memory cells to be tested and the data held in respective memory cells are collated with expected values thereof at one time.

Concretely, a semiconductor memory device in the present invention has a word lines simultaneously driving circuit and a test data writing circuit, in addition to a plurality of memory cells arranged so as to compose rows the number of which is X and columns the number of which is Y, word lines the number of which is X for selecting Y memory cells which compose one row of the plurality of memory cells, digit buses the set number of which is Y for selecting X memory cells which compose one column of the plurality of memory cells, a word line sequentially driving circuit for selectively driving one of The X word lines so as to select Y memory cells which compose one row of the plurality of memory cells according to a given row address, and a normal data writing circuit for writing a normal data into one of the Y memory cells selected by the word line sequentially driving circuit through one set of the Y sets of digit buses according to a given column address. The word lines simultaneously driving circuit is a circuit for, when a writing control signal is received, inhibiting an operation of the word line sequentially driving circuit and driving the X word lines at one time so as to select all of the plural memory cells. The test data writing circuit is a circuit for, when the writing control signal is received, inhibiting an operation of the normal data writing circuit and writing some particular pattern of test data at one time into the plural memory cells selected by the word lines simultaneously driving circuit through the Y sets of digit busses.

Under the above construction, in a normal operation, one memory cell is selected according tic a row address and a column address and a normal data is written into the selected memory cell . The normal operation is inhibited during a test when the writing control signal is supplied. During the test, all memory cells are selected at one time regardless of the row address and the column address, then some particular pattern of test data is written into the selected memory cells at one time. Thereby, a data writing time is reduced to a time required for one memory access. Further, the data writing time is independent from a memory capacity.

Preferably, the word lines simultaneously driving circuit includes an electric potential changing circuit for changing an electric potential of the X word lines at one time according to a logic value of a given word line control signal. Also, the test data writing circuit includes a test data injection circuit for transmitting the test data responsive to a given data specifying signal at one time to the Y sets of digit buses. Each of the Y sets of digit buses may be composed of a pair of bit lines for two data signals each having a logic value which is inverse to each other.

In order to collate the data held in respective memory cells with the expected values thereof at one time, first and second data judging lines are respectively laid along the plurality of memory cells and a first potential setting circuit and a first potential changing circuit are provided. The first potential setting circuit is a circuit for selectively precharging one of first and second data judging lines according to a given pattern selecting signal so as to precharge the first data judging line when a non-inverse pattern of test data is written into the plurality of memory cells and so as to precharge the second data judging line when an inverse pattern off test data is written thereinto. The first potential changing circuit is a circuit having a function of grounding the first data judging line if at least one of the data held in the plurality of memory cells does not conform with the expected value thereof when the non-inverse pattern of test data is written into the plurality of memory cells and of grounding the second data judging line if at least one of the data held in the plurality of memory cells does not conform with the expected value thereof when the inverse pattern of test data is written thereinto.

Under the above construction, the data held in each memory cell and the expected value thereof are collated at one time based on an electric potential of the first data judging line when the non-inverse pattern of test data is applied and based on an electric potential of the second data judging line when the inverse pattern of test data is applied. Consequently, a data judging time is reduced to a time required for one memory access. Further, the data judging time is independent from the memory capacity. In brief, reduction of the test time is enabled only by adding a few circuits (the first potential setting circuit and the first potential changing circuit) without modifying any construction and function of each memory cell. In addition, in case with no memory errors, since an electric current is not conducted in any of both data judging lines, the consumptive electric current during the data judgment can be reduced.

In case where a plural sets of first and second data judging lines and the first potential changing circuits are provided so that the number of the sets corresponds to the number of the memory cells, one overall judgment outputting signal line is provided and a second potential setting circuit for precharging the overall judgment outputting signal line and a second potential changing circuit having a function of grounding the overall judgment outputting signal line when at least one of the plural first data judging lines is grounded or widen at least one of the plural second data judging lines is grounded are further provided.

A testing method according to the present invention is a method for testing a semiconductor memory device having a plurality of memory cells to which addresses are differently allocated from one another, including the steps of writing some particular pattern of test data into the plural memory cells at one time and of judging whether the data held in each of the plural memory cells conforms with the expected value thereof after the writing step. This method enables the data writing time to be reduced to a time required For one memory access.

Preferably, whether the data held in each of the plural memory cells conforms with the expected value thereof is judged at one time. In this case, a data judging time can be also reduced to a time required for one memory access.

In the writing step ALL "0"s or ALL "1"s pattern of test data is written into the plural memory cells at one time, a test, for example, corresponding to the essential test, the SCAN, can be performed in high speed.

In the judging step after the ALL "0" s or ALL "1" s writing step, when the data held in the plural memory cells are rewritten one by one while whether the data held in each of the plural memory cells conforms with the expected value is sequentially judged in order to perform a test based on another pattern of test data than ALL "0" s and ALL "1" s, a test, for example, corresponding to the MARCHING can be performed in high speed.

PREFERRED EMBODIMENT OF THE INVENTION

A description is made below about a semiconductor memory device and a method of testing the same, with reference to accompanying drawings.

Figure 1:
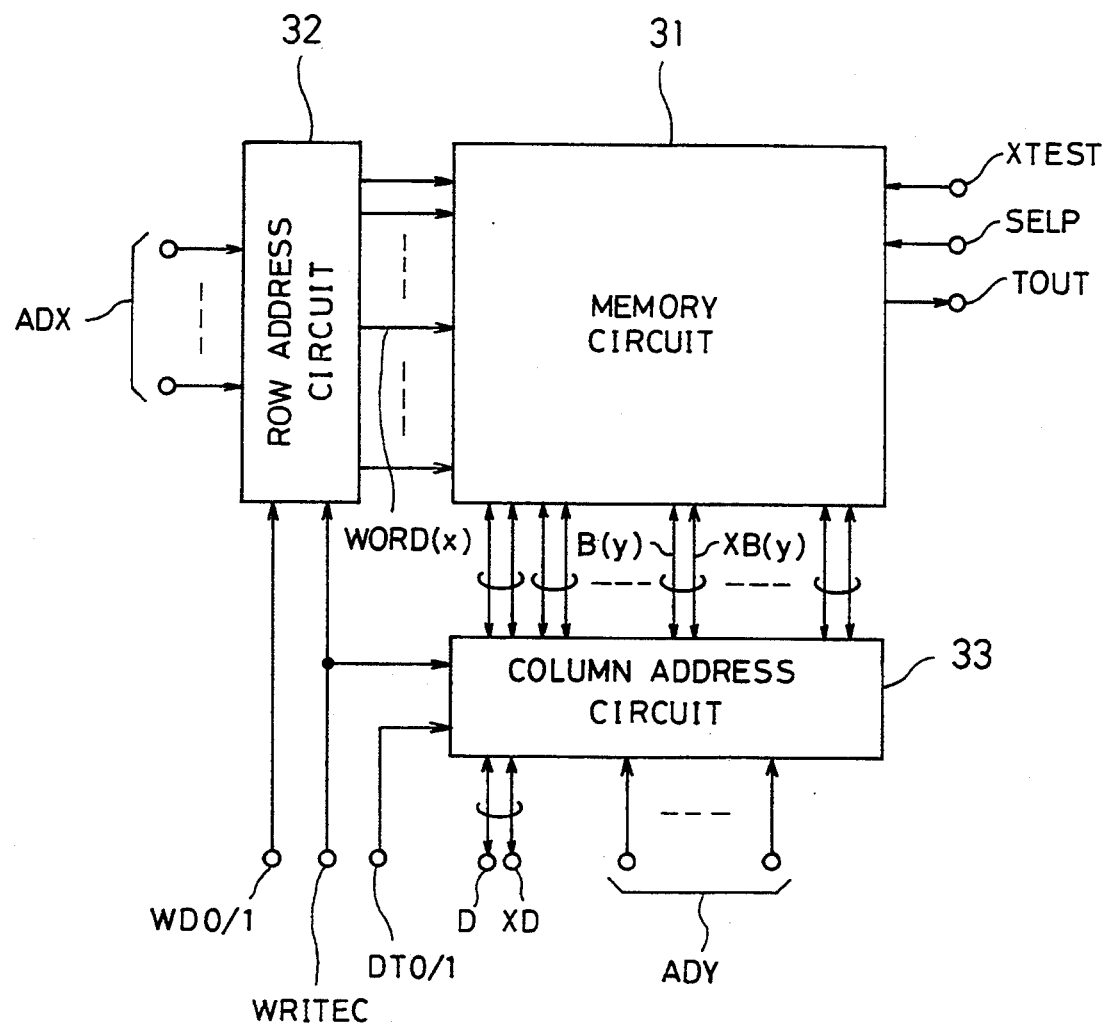
FIG. 1 is a block diagram showing an schematic construction of a semiconductor memory device according to an embodiment of the present invention.

FIG. 1 is a block diagram showing a schematic construction of a semiconductor memory device having a 4M×1-bit memory construction according to an embodiment of the present invention. The semiconductor memory device includes three circuit blocks, namely, a memory circuit 31, a row address circuit 32 and a column address circuit 33.

The memory circuit 31 has 4M bits memory cells arranged in matrix of 2048×2048 and a test circuit for judging at one time whether data held in respective memory cells conform with an expected value thereof. The test circuit receives a test signal XTEST for initiating a Judgment. The test circuit also receives a pattern selecting signal SELP for switching an operation for a non-inverse pattern of test data to that for an inverse pattern of test data, and vice versa. The judging result is outputted via an overall judgment outputting signal line TOUT.

The row address circuit 32 performs either a normal operation or a test operation. In detail, during the normal operation when a writing control signal WRITEC an electric potential of which is "L" is supplied, the row address circuit 32 selectively drives one of 2048 word lines WORD(x) (x=0, 1, ..., 2047) so as to select 2048 memory cells which compose one row of 4M bits memory cells in the memory circuit 31 according to a given row address ADX. During the test operation when the writing control signal WRITEC the electric potential of which is "H" is supplied, the row address circuit 32 drives the 2048 word lines WORD(x) at one time according to a word line control signal WD0/1 so as to select all of the 4M bits memory cells in the memory circuit 31, regardless of the row address ADX.

The column address circuit 33 also performs either a normal operation or a test operation. In detail, during the normal operation when the writing control signal WRITEC of "L" is supplied, the column address circuit 33 writes a normal data given via a pair of external data lines D, XD into one of the 2048 memory cells selected by the normal operation of the row address circuit 32 through one set of 2048 sets of bit lines (digit buses) B(y), XB(y) (y=0, 1, ..., 2047) according to a given column address ADY. During the test operation when the writing control signal WRITEC of "H" is supplied, the column address circuit 33 writes some particular pattern of test data according to a data specifying signal DT0/1 at one time into all of the 4M bits memory cells in the memory circuit 31 selected by the test operation of the row address circuit 32 via the 2048 pairs of bit liens B(y), XB(y), regardless of the column address ADY. Wherein, the pair of external data lines D, XD receives two data signals each having a logic value which is inverse to each other.

Each inside construction of the three circuit blocks 31, 32, 33 in FIG.1 is described in due course.

Figure 2:
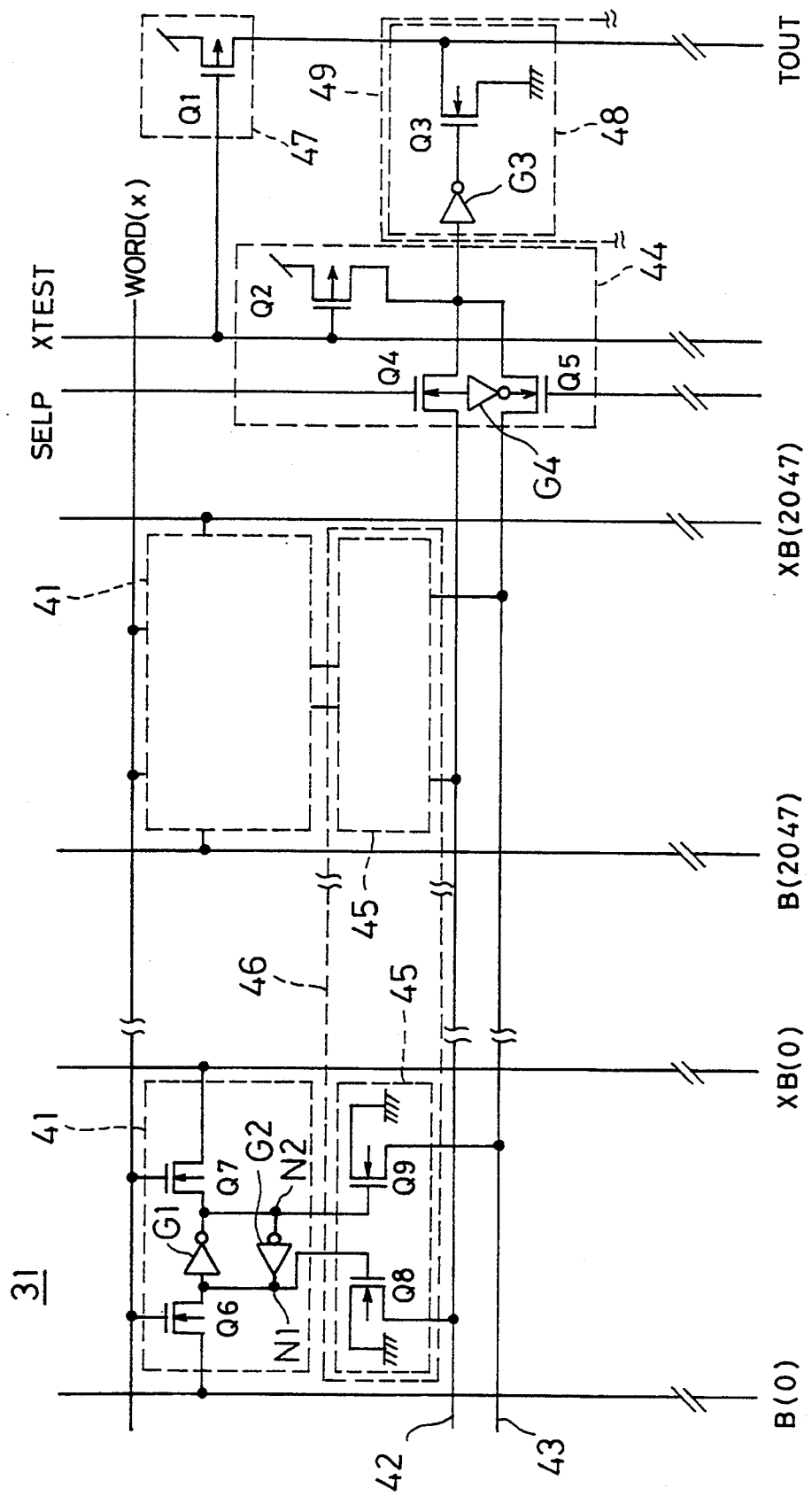
FIG. 2 is a circuit diagram showing an inside construction of a memory circuit in FIG. 1.

FIG. 2 is a circuit diagram showing the inside construction of the memory circuit 31. In the figure, reference symbols Q1–Q9 and G1–G4 are MOS transistors and logic gates (inverters) respectively.

Each of the 4M bits memory cells 41 arranged in matrix of 2048×2048 has two N-channel type MOS transistors Q6, Q7 and two inverters G1, G2. Each MOS transistor Q6, Q7 is connected at a gate electrode thereof to the word line WORD(x) and at drain thereof to each of bit lines B(y), XB(y). The inverters G1, G2 are inserted into respective sources off the MOS transistors Q6, Q7 so as to form a flip-flop circuit. As long as the memory cell 41 has no abnormality, in the flip-flop circuit a first cell node N1 and a second cell node N2 respectively retains the respective electric potentials "L" and "H" when "0" is written thereinto via the pairs of bit lines B(y), XB(y). Contrarily, when "1" is written thereinto, the first cell node N1 and the second cell node N2 respectively retains the respective electric potentials "H" and "L". In other words, the electric potentials of each off first and second cell nodes N1, N2 are necessarily decided according to the data written into the memory cells 41.

2048 non-inverse data judging lines (first data judging lines ) 42 and inverse data judging lines ( second data judging lines) 43 the number of which is the same as the non-inverse data judging lines are laid along each row of the memory cells 41. 2048 first potential setting circuits 44 are arranged in the column direction of the memory cells 41 for selectively precharging one of the non-inverse and inverse data judging lines 42, 43 according to the pattern selecting signal SELP. Each first potential setting circuit 44 composed of one P-channel type MOS transistor Q2, two N-channel type MOS transistors Q4, Q5 and one inverter G4 and is initiated when the electrical potential of the test signal XTEST is "L".

On the other hand, provided for each memory cell 41 is a cell data detecting circuit 45 having two N-channel type MOS transistors Q8, Q9. The MOS transistor Q8 in the cell data detecting circuit 45 is connected at a gate electrode thereof to the first cell node N1 of the memory cell 41 and is wired-OR-connected at a drain thereof to the non-inverse data judging line 42 and a source thereof is grounded. The other MOS transistor Q9 is connected at a gate electrode thereof to the second cell node N2 of the memory cell 41 and is wired-OR-connected at a drain thereof to the inverse data judging line 43 and a source thereof is grounded. The 2048 cell data detecting circuits 45 arranged along each row of the memory cells 41 composes a first potential changing circuit 46 having a Function of grounding the non-inverse data judging line 42 when at least one of the non-inverse pattern of test data "0" written into the corresponding 2048 memory cells 41 does not conform with the expected value thereof and of grounding the inverse data judging line 43 when at least one of the inverse pattern of test data "1" written into the corresponding 2048 memory cells 41 does not conform with the expected value thereof. The 2048 first potential changing circuits 46 each having such a function are arranged in the column direction of the memory cells 41.

A second potential setting circuit 47 is a circuit for precharging the overall judgment outputting signal line TOUT and has one P-channel type MOS transistor Q1 the gate electrode of which is supplied with the test signal XTEST. Further, 2048 judging line potential detecting circuits 48 each composed of one inverter G3 and one N-channel type MOS transistor Q3 are arranged in the column direction of the memory cells 41 in order to detect the electric potential of the non-inverse data judging line 42 or the inverse data judging line 43 selected by the two N-channel type MOS transistors Q4, Q5 in the first potential setting circuit 44. Each output of the N-channel type MOS transistors Q3 is wired-OR-connected to the overall judgment outputting signal line TOUT. The 2048 judging line potential detecting circuits 48 compose a second potential changing circuit 49 for grounding the overall judgment outputting signal line TOUT when at least one of the 2048 non-inverse data judging lines 42 is grounded or when at least one of the 2048 inverse data judging lines 43 is grounded.

Figure 3:
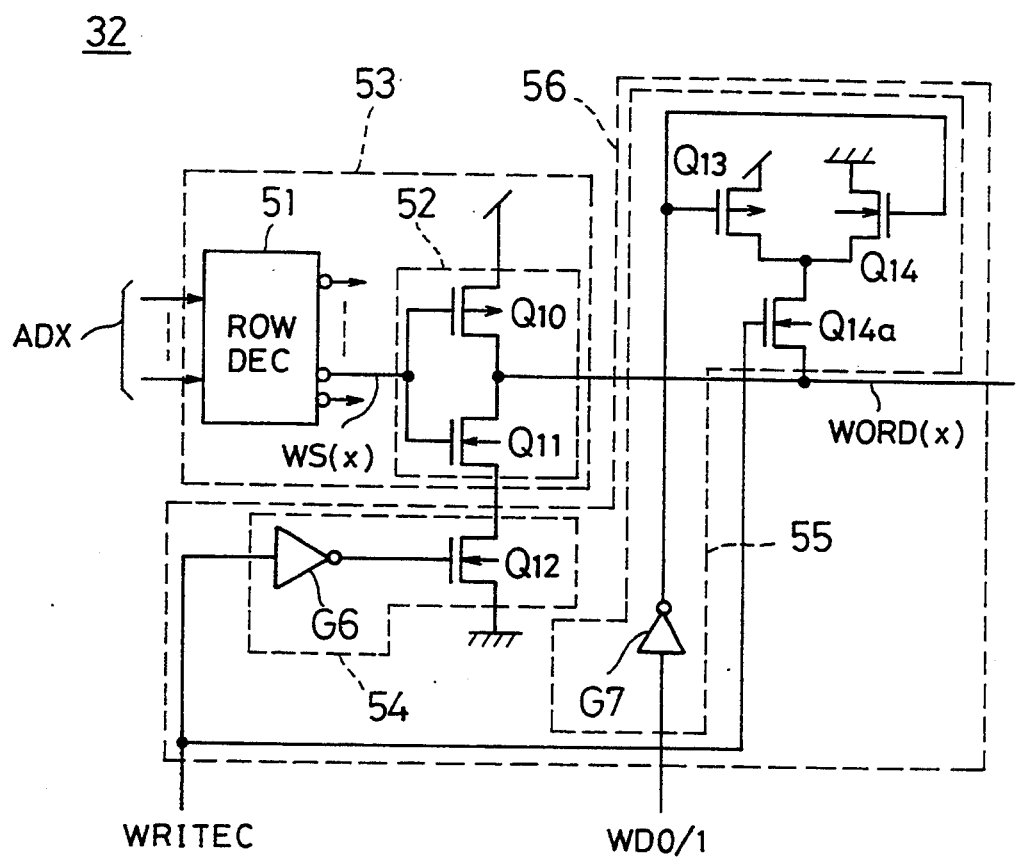
FIG. 3 is a circuit diagram showing an inside constructor of a row address circuit in FIG. 1.

FIG. 3 is a circuit diagram showing an inside construction of the row address circuit 32. In the figure, reference symbols Q10–Q14a are MOS transistors and G6 and G7 are logic gates (inverters) respectively.

51 denotes a row decoder for activating one of the 2048 word selecting signals WS(x) (x=0, 1, ..., 2047) to bring the potential thereof to "L" according to the given row address ADX. 2048 first word line driving circuits 52 are provided so as to respectively correspond to the 2048 word selecting signals WS(x). Each first word line driving circuit 52 has a combination of a P-channel type MOS transistor Q10 and an N-channel type MOS transistor Q11 for driving one corresponding word line WORD(x) when the word selecting signal WS(x) from the row decoder 51 is activated. In other words, the row decoder 51 and the 2048 first word line driving circuits 52 compose a word line sequentially driving circuit 53 for selectively driving one of the 2048 word lines WORD(x) (x=0, 1, ..., 2047) according to the row address ADX.

Further provided are 2048 normal access inhibiting circuits 54 each composed of one inverter G6 and one N-channel type MOS transistor inhibiting an operation of all the first word line driving circuits 52 during the test operation when the writing control signal WRITEC of "H" is supplied. Also, provided at the respective word lines WORD(x) are 2048 second word line driving circuits (electric potential changing circuits) 55 each composed of one inverter G7, one P-channel type MOS transistor Q13 and two N-channel type MOS transistors Q14, Q14a so as to change the electric potential of the 2048 word lines WORD(x) (x=0, 1, ..., 2047) at one time according to the logic value of the word line control signal WD0/1 during the test operation. In other words, the normal access inhibiting circuits 54 and the second word line driving circuits 55 compose a word lines simultaneously driving circuit 56 for inhibiting the operation of the word line sequentially driving circuit 53 and driving the 2048 word lines WORD(x) (x=0, 1, ..., 2047) at one time so as to select all the memory cells 41 in the memory circuits 31 when receiving the writing control signal WRITEC.

Figure 4:
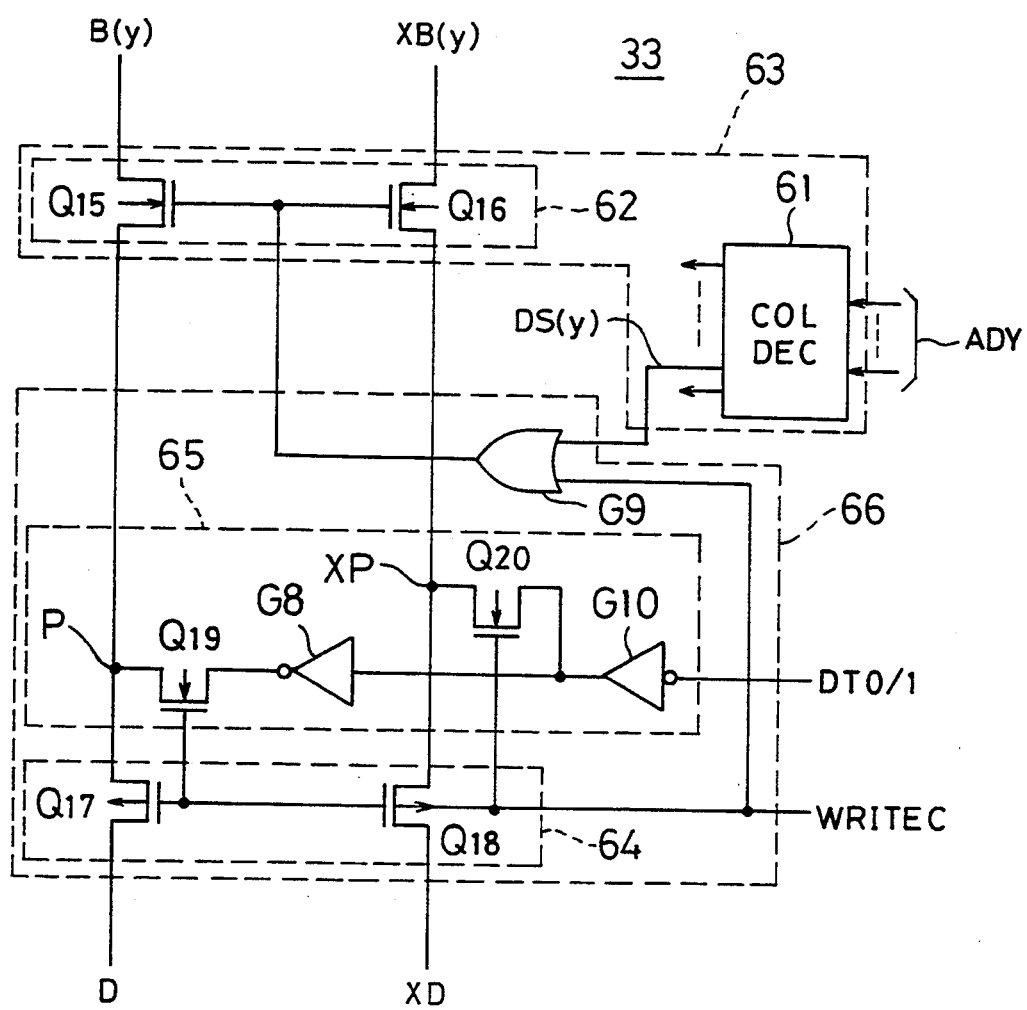
FIG. 4 is circuit diagram showing an inside construction of a column address circuit in FIG. 1.

FIG. 4 is a circuit diagram showing an inside construction of the column address circuit 33. In the figure, reference symbols Q15–Q20 are MOS transistors, G8 and G10 are logic gates (inverters) and G9 is a logic gate (OR gate).

61 denotes a column decoder for activating one of the 2048 column selecting signals DS(y) (y=0, 1, ..., 2047) to bring the electrical potential thereof to "H" according to the given column address ADY. 2048 column address switches 62 are provided so as to correspond to the respective 2048 column selecting signals DS(y). Each column address switch 62 has two N-channel type MOS transistors Q15, Q16 and is in ON state so as to connect a pair of external data lines D, XD to one corresponding pair of bit lines B(y), XB(y) when the column selecting signal DS(y) from the column decoder 61 is activated. In other words, the column decoder 61 and the 2048 column address switches 62 compose a normal data writing circuit 63 for writing a normal data given via the pair of external data lines D, XD into one of the 2048 memory cells 41 which composes one row selected via the word line sequentially driving circuit 53 in the row address circuit 32 through one of the 2048 pairs of bit lines B(y), XB(y) (y=0, 1, ..., 2047) which corresponds to the column address ADY.

Further, a normal access inhibiting switch 64 composed of two P-channel type MOS transistors Q17, Q18 intervenes between internal nodes P, XP and the pair of external data lines D, XD so as to cut off all the column address switches 62 from the pair of external data lines D, XD during the test when the writing control signal WRITEC of "H" is supplied. 2048 OR gates G9 are provided each for giving a logical sum signal of writing control signal WRITEC and column selecting signal DS (y) to the gate electrodes of the two N-channel type MOS transistors Q15, Q16 of the column address switch 62 so that all the column address switches 62 are in ON state during the test. Further, a test data injection circuit 65 composed of the two N-channel type MOS transistors Q19, Q20 and the two inverters G8, G10 is connected to the internal nodes P, XP so as to transmit a test data according to the given data specifying signal DT0/1 to the 2048 pairs of bit lines B(y), XB(F) (y=0, 1, ..., 2047) at one time during the test. In other words, the normal access inhibiting switch 64, the 2048 OR gates G9 and the test data injection circuit 65 compose a test data writing circuit 66 for inhibiting the operation of the normal data writing circuit 63 and writing some particular pattern of data at one time into the memory cells 41 in the memory circuit 31 selected by the word lines simultaneously driving circuit 56 in the row address circuit 32 via the 2048 pairs of bit lines B(y), XB(y) (y=0, 1, ..., 2047) when receiving the writing control signal WRITEC.

An operation of the semiconductor memory device having the above construction according to the embodiment of the present invention is described below.

Each of normal and test operations for writing data into the memory circuit 31 is described separately.

At the normal operation, the writing control signal WRITEC the electric potential of which is "L" is supplied to the row address circuit 32 and the column address circuit 33. Also, the row address circuit 32 receives the row address ADX and the column address circuit 33 receives the column address ADY and the normal data on the pair of external data lines D, XD.

In the row address circuit 32 in FIG. 3, since the writing control signal WRITEC is "L", the N-channel type MOS transistor Q12 off the normal access inhibiting circuit 54 is in ON state, which allows the operation of the first word line driving circuit 52. On the other hand, the N-channel MOS transistor Q14a of the second word line driving circuit 55 connected to the word line WORD(x) is in OFF state, which invalidates the word line control signal WD0/1. Consequently, the word lines simultaneously driving circuit 53 selectively drives one of the 2048 word lines WORD(x) (x=0, 1, ..., 2047) to "H" according to the row address ADX. As a result, the 2048 memory cells 41 composing one row of the 4M bits memory cells in the memory circuit 31 shown in FIG. 2 are selected, so that the two N-channel type MOS transistors Q6, Q7 in each memory cell 41 is in ON state.

While, supply of the writing control signal WRITEC of "L" to the column address circuit 33 in FIG. 4 leads to ON state in both of the two P-channel type MOS transistors Q17, Q18 composing the normal access inhibiting switch 64 and to OFF state in both of the two N-channel type MOS transistors Q19, Q20 in the test data injection circuit 65. As a result, the internal notes P, XP and the pair of external data lines D, XD are connected to each other and the data specifying signal DT0/1 is invalidated. Consequently, the normal data writing circuit 63 writes the normal data given via the pair of external data lines D, XD into one of the 2048 memory cells 41 which belongs one row selected by the normal operation of the row address circuit 32 through one of the 2048 pairs of bit lines B(y), XB(y) (y=0, 1, . . . , 2047) according to the column address ADY.

At the test operation, the writing control signal WRITEC the electric potential of which is "H" is supplied to the row address circuit 32 and the column address circuit 33. Further, the row address circuit 32 receives the word line control signal WD0/1 and the column address circuit 33 receives the data specifying signal DT0/1.

in the row address circuit 32, since the writing control signal WRITEC is "H", the N-channel type MOS transistor Q12 of the normal access inhibiting circuit 54 is in OFF state, which inhibits the operation of the first word line driving circuit 52. On the other hand, each of the N-channel type MOS transistors Q14a of the 2048 second word line driving circuits 55 is in ON state, with a result that each electric potential of the 2048 word lines WORD(x) (x=0, 1, . . . , 2047) is changed at one time according to the logic value of the word line control signal WD0/1.

While, supply of the writing control signal WRITEC of "H" to the column address circuit 33 leads to OFF state in both of the two P-channel type MOS transistors Q17, Q18 composing the normal access inhibiting switch 64, so as to intercept between the internal nodes P, XP and the pair of external data lines D, XD. Also, the two N-channel type MOS transistors Q15, Q16 composing each of all the column address switches 62 are in ON state via the OR gate G9 by the writing control signal WRITEC of "H", regardless of the column address ADY. Further, the two N-channel MOS transistors Q19, Q20 in the test data injection circuit 65 are both in ON state. As a result, some particular pattern of test data according to the data specifying signal DT0/1 is written at one time into the 4M bits memory cells 41 in the memory circuit 31 selected by making the logic value of the word line control signal WD0/1 toward the row address circuit 32 "1" via the 2048 pairs of bit lines B(y), XB(y) (y=0, 1, . . . , 2047). Then, when the logic value of the word line control signal WD0/1 is returned to "0", simultaneous writing operation into all the memory cells 41 terminates. Namely, the non-inverse pattern off test data (ALL "0" s) is written into the 4M bits memory cells 41 when the logic value of the data specifying signal DT0/1 is "0", and the inverse pattern of test data (ALL "1" s) is written into the 4M bits memory cells 41 when the logic value of the data specifying signal DT0/1 is "1".

According to the present embodiment, as described above, the writing operation of test data into all the 4M bits memory cells 41 terminates in a time required for one memory access (operation cycle time) T, for example 100 ns. In addition, the time required for the writing is independent from a memory capacity.

After some particular pattern of test data, namely, ALL "0" s or ALL "1" s is written into the memory circuit 31 in FIG. 2 in the above way, whether the data held in each of the 4M bits memory cells 41 conforms with the expected value thereof is checked at one time. This simultaneously judging operation is described next.

The simultaneously judging operation is initiated by applying the test signal XTEST of "L" to the memory circuit 31 after the electric potential of the pattern selecting signal SELP is decided according to the test data written into the memory circuit 31. Wherein, during the judging operation, neither of the word lines WORD(x) is driven and the two N-channel type MOS transistors Q6, Q7 in each memory cell 41 are kept in OFF state.

When the non-inverse pattern of test data, i.e., ALL "0" s is written into the 4M bits memory cells 41, the pattern selecting signal SELP is made to be "H", then the test signal XTEST of "L" supplied. Thereby in each of the first potential setting circuits 44, the N-channel type MOS transistor Q4 connected to the non-inverse data judging line 41 is in ON state the N-channel type MOS transistor Q5 connected to the inverse data judging line 43 is in OFF state and the P-channel type MOS transistor Q2 is in ON state. That means that only the non-inverse data judging lines 42 are selectively precharged. Also, the P-channel type MOS transistor Q1 composing the second potential setting circuit 47 receives the test signal XTEST to be in ON state, which means that the overall judgment outputting signal line TOUT is precharged.

As described above, when the non-inverse pattern of test data (ALL "0" s) is written, the electric potentials of first and second cell nodes N1, N2 of each memory cell 41 are respectively "L" and "H" as long as the memory cell 41 has no abnormality. Therefore in each cell data detecting circuit 45, the N-channel type MOS transistor Q8 connected at the gate electrode thereof to the first cell node N1 is kept in OFF state. In detail, the non-diverse data judging line 42 precharged by the first potential setting circuit 44 is held in the electric potential of "H" as long as each of the 2048 memory cells 41 which compose one row holds the data which conforms with the expected value "0". When all the 2048 non-inverse data judging lines 42 are kept in the electric potential of "H", the overall judgment outputting signal line TOUT is not grounded through the second potential changing circuit 49 but is held in the electric potential of "H".

On the other hand, when at least one of the data held in the 2048 memory cells 41 which compose one row does not conform with the expected value "0", the non-inverse data judging line 42 is grounded via the N-channel type MOS transistor Q8 in a certain cell data detecting circuit 45. As a result, the electric potential of the non-inverse data judging line 42 is "L", so that the electric potential of the 15 overall judgment outputting signal line TOUT is brought down to "L".

In other words, the overall judgment outputting signal line TOUT is In the electric potential of "H" (test PASS) when each of the 4M bits memory cell is 41 holds the expected value "0", and is in the electrical potential of "L" (test FAIL) when at last one bit of the memory cells holds a data different from the expected value "0".

In contrast to the above operation for the non-inverse pattern of test data, when an inverse pattern of test data, i.e., ALL "1"s is written into the 4M bits memory cells 41, the pattern selecting signal SELP is made to be "L", then the test signal XTEST of "L" is supplied. Thereby, only the inverse data judging lines 41 are precharged via the first potential setting circuits 44 and the overall judgment outputting signal line TOUT is precharged via the second potential setting circuit 47. While first and second cell nodes N1, N2 of each memory cell 41 are respectively in the electric potentials of "H" and "L" as long as the memory cell 41 has no abnormality. Therefore, in each cell data detecting circuit 45, the N-channel type MOS transistor Q9 connected at the gate electrode thereof to the second cell node N2 is held in OFF state. In other words, as long as each of the 2048 memory cells 41 which compose one row holds the data which conforms with the expected value "1", the inverse data judging line 43 is held in the electric potential of "H". When all of the 2048 inverse data judging lines 43 are held in the electric potential of "H", the overall judgment outputting signal line TOUT is held in the electric potential of "H". On the other hand when at least one of the data held in the 2048 memory cells composing one row does not conform with the expected value "1", the inverse data judging line 43 is grounded via the N-channel type MOS transistor Q9 in a certain cell data detecting circuit 45. As a result, the inverse data judging line 43 is in the electric potential of "L", so that the electric potential of the overall judgment outputting signal line TOUT is brought down to "L" by the second potential changing circuit 49.

Namely, the electric potential of the overall judgment outputting signal line TOUT is "H" (test PASS) when each of the 4M bits memory cells 41 holds the expected value "1", and is "L" (test FAIL) when at least one bit of the memory cells 41 holds a data different from the expected value "1".

According to the present embodiment, as described above, it takes time required for only one memory access (operation cycle time) T, for example, 100 ns to judge whether the data held in each of 4M bits memory cells 41 conforms with the expected value thereof. In addition, the time required for the judgment is independent from the memory capacity. Further, when the test results in PASS, the electric current is not conducted through any of the non-inverse data judging line 42, the inverse data judging line 43 and the overall judgment outputting signal line TOUT, thus reducing the consumptive electric current during the judgment.

Figure 5:
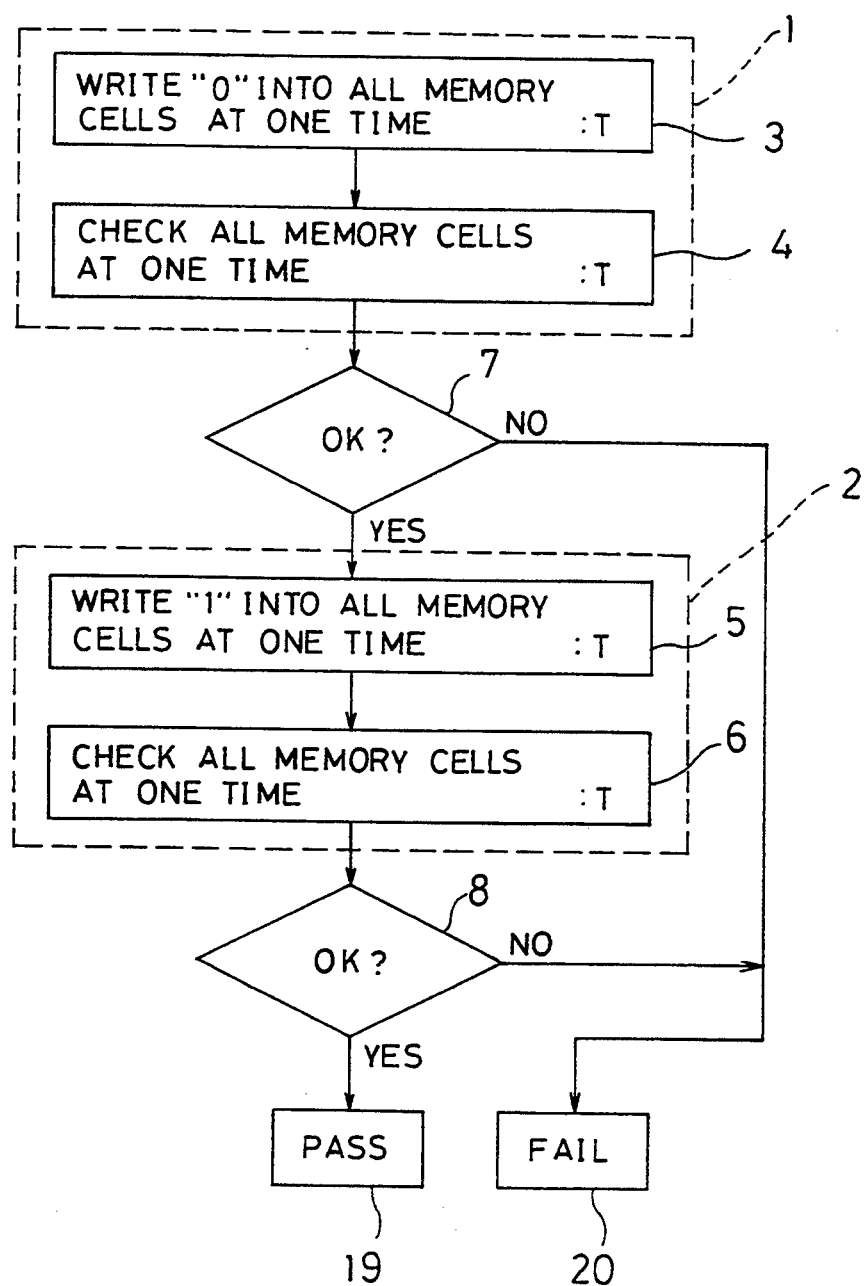
FIG. 5 is a flow chart showing a procedure of a method of testing a semiconductor memory device according to an embodiment of the present invention.

FIG. 5 is a flow chart showing a procedure of a method of testing the semiconductor memory device according to an embodiment of the present invention which corresponds to the aforementioned SCAN.

In FIG. 5, a test block 1 of ALL "0"s includes a simultaneously writing step 3 of writing the non-inverse pattern of test data into the 4M bits memory cells 41 at one time and a simultaneously judging step 4 of judging at one time whether the data held in each of the 4M bits memory cells 41 conforms with the expected value "0" after the simultaneously writing step 3. With unconformity detected in any of the memory cells 41, the test results in FAIL to branch from a step 7 into a step 20.

With conformity obtained in all the memory cells 41, the test proceeds to a test block 2 of ALL "1"s. The test block 2 of ALL "1"s includes a simultaneously writing step 5 of writing the inverse pattern of test data into the 4M bits memory cells 41 at one time and a simultaneously judging step 6 of judging at one time whether the data held in each of the 4M bits memory cells 41 conforms with the expected value "1" after the simultaneously writing step 5. With unconformity detected in any of the memory cells is 41, the test results in FAIL to branch from a step 8 into the step 20. Contrary thereto, with conformity obtained in all the memory cells 41, the test results in PASS to proceed from the step 8 to a step 19.

According to the testing method of the embodiment shown in FIG. 5, each time required for the respective steps 3, 4, 5, 6 is equal to a time required for one memory access (operation cycle time) T. That means that the total test time in the present embodiment is 4 T and is independent from the memory capacity, which is different from the conventional one. Concretely, suppose that the operation cycle time T is 100 ns, the total test time (4 T) is 400 ns even in the case the semiconductor memory device with a memory construction of 4M×1 bit (N=4M bits), which leads to a great decrease of testing time, compared with a conventional testing time which is in a level of a few seconds. In case where a function check of peripheral circuits around the memory circuit 31 is conducted, though a time of several times of the operation cycle time T is further needed, this additional time can be ignored, compared with the conventional testing time which is in a level of a few seconds.

In the testing method in FIG. 5 the simultaneously judging steps 4, 6 may be changed to conventional sequentially judging steps respectively. In case of, for example, the aforementioned test of MARCHING, when the simultaneously writing steps 3, 5 in FIG. 5 are respectively applied to a step of writing the non-inverse pattern of test data (ALL "0"s) into the 4M bits memory cells 41 and a step of writing the inverse pattern of test data (ALL "1"s) thereinto, conventional 5N×2 times memory access is reduced to 4N×2 times, which means 20% reduction of the total test time. In addition, the present invention can be applied not only to the N-system test such as SCAN, MARCHING but also to $N^{1.5}$-system test and $N^2$-system test.

The circuit for simultaneous writing as shown in FIGS. 3 and 4 can be changed into another construction having the same function. For instance, in the column address circuit 33 in FIG. 4, where the data injection method of the test data injection circuit 65 is changed, it is possible to write at one time into the memory circuit 31 some particular pattern of test data other than ALL "0"s as the non-inverse pattern of test data and that other than ALL "1"s as the inverse pattern of test data. The test data may be given to the memory circuit 31, using the pair of external data lines D, XD. The circuit for simultaneous judgment in FIG. 2 can be also changed to another construction having the same function. When two of non-inverse and inverse data judging lines 42, 43 are laid so as to weave along all of the 4M bits memory cells 41, the provision of the second potential setting circuit 47 and the second potential changing circuit 49 can be deleted. It is also possible to lay the data judging lines 42, 43 only to a part of the memory cells (not all memory cells) 41. When changing the connection pattern of the two N-channel type MOS transistors Q8, Q9 in some of the cell data detecting circuits 45 to non-inverse and inverse data judging lines 42, 43, it is possible to perform the simultaneous judgment using another pattern of test data than ALL "0" s and ALL "1" s.

I claim:

1. A semiconductor memory device, comprising:
    a plurality of memory cells arranged so as to comprise rows the number of which is X and columns the number of which is Y;
    word lines the number of which is X for selecting Y memory cells which comprise one row of said plural memory cells;
    digit buses the set number of which is Y for selecting X memory cells which comprise one column of said plural memory cells;
    a first circuit means for selectively driving one of said X word lines so as to select Y memory cells which comprise one row of said plural memory cells according to a given row address;
    a normal data writing circuit for writing a normal data given from outside into one of the Y memory cells selected by said first circuit means through one of said Y sets of digit buses according to a given column address;
    a second circuit means for, when a writing control signal is received, inhibiting an operation of said first circuit means and driving a selected number of said X word lines at the same time so as to select all of said plural memory cells to be examined; and
    a test data writing circuit for, when said writing control signal is received, inhibiting an operation of said normal data writing circuit and writing some particular pattern of test data at the same time into said plural memory cells selected by said second circuit means through said Y sets of digit buses.

2. The semiconductor memory device according to claim 1, wherein said second circuit means includes an electric potential changing circuit for changing an electric potential of said X word lines at the same time according to a logic value of a given word line control signal.

3. The semiconductor memory device according to claim 1, wherein said test data writing circuit includes a test data injection circuit for transmitting test data according to a given data specifying signal at the same time to said Y sets of digit buses.

4. The semiconductor memory device according to claim 1, wherein each of said Y sets of digit buses includes a pair of bit lines for two data signals each having a logic value which is inverse to each other.

5. A semiconductor memory device, comprising:
    a plurality of memory cells into which some particular test data is to be written:
    first and second data judging lines each laid along said plural memory cells;
    a first potential setting circuit for selectively setting one of first and second data judging lines in a first electric potential according to a given pattern selecting signal so as to set said first data judging line in the first electric potential when a non-inverse pattern of test data is written into said plural memory cells and to set said second data judging line in the first electric potential when an inverse pattern of test data is written into said plural memory cells; and
    a first potential changing circuit having a function of changing the electric potential of said first data judging line into a second electric potential when at least one of the data held in said plural memory cells does not conform with an expected value thereof at writing of the non-inverse pattern of test data into said plural memory cells and changing the electric potential of said second data judging line into the second electric potential when at least one of the data held in said plural memory cells does not conform with an expected value thereof at writing of the inverse pattern of test data into said plural memory cells.

6. The semiconductor memory device according to claim 5, wherein said plural sets of first and second data judging lines and said first potential setting circuit the set number of which corresponds to the number of said memory cells are provided, said semiconductor memory device further comprising:
    one overall judgment outputting signal line;
    a second potential setting circuit for setting said overall judgment outputting signal line in a first outputting electric potential; and
    a second potential changing circuit having a function of changing the electric potential of said overall judgment outputting signal line into a second outputting electric potential when at feast one of said plural first data judging lines has said second electric potential or when at least one of said plural second data judging lines has said second electric potential.

7. A method of testing a semiconductor memory device having a plurality of memory cells to which addresses are differently allocated from one another, comprising the steps of:
    writing some particular pattern of test data into said plural memory cells to be examined at the same time: and
    judging whether the data held in each of said plural memory cells conforms with an expected value thereof after said writing step without driving word lines connected to said plural memory cells.

8. The method of testing a semiconductor memory device according to claim 7, wherein said judging step includes a step of judging at the same time whether the data held in each of said plural memory cells conforms with an expected value thereof.

9. The method of testing a semiconductor memory device according to claim 7, wherein said writing step includes a step of writing ALL "0" s or ALL "1" pattern of test data into said plural memory cells at the same time.

10. The method of testing a semiconductor memory device according to claim 9, wherein said judging step includes, in order to perform a test based on another pattern of test data than ALL "0" s and All "1" s, a step of sequentially rewriting the data held in said plural memory cells one by one while sequentially judging whether the data held in each of said plural memory cells conforms with an expected value thereof.

11. The semiconductor memory device according to claim 1 further comprising:
    means for judging whether the data held in each of said plural memory cells conforms with an expected value thereof, without driving word lines connected to said plural memory cells.

* * * * *